United States Patent
Kinyua et al.

(10) Patent No.: US 8,576,003 B2
(45) Date of Patent: Nov. 5, 2013

(54) CASCADED CLASS D AMPLIFIER WITH IMPROVED LINEARITY

(75) Inventors: Martin Kinyua, Cedar Park, TX (US); Ruopeng Wang, Santa Clara, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 50 days.

(21) Appl. No.: 13/410,733

(22) Filed: Mar. 2, 2012

(65) Prior Publication Data

US 2013/0229230 A1  Sep. 5, 2013

(51) Int. Cl.
  *H03F 3/38* (2006.01)
  *H03K 9/08* (2006.01)

(52) U.S. Cl.
  USPC ........... 330/10; 330/251; 330/207 A; 375/238

(58) Field of Classification Search
  USPC .......................... 330/10, 251, 207 A; 375/238
  See application file for complete search history.

*Primary Examiner* — Robert Pascal
*Assistant Examiner* — Khiem Nguyen
(74) *Attorney, Agent, or Firm* — Duane Morris LLP

(57) ABSTRACT

An amplifier includes first and second stages. The first stage includes an input node for receiving an analog input signal, an analog digital converter for converting the analog input signal to a digital input signal, and a first switching circuit for outputting a first analog intermediate output signal in response to receiving a digital pulse width modulated signal that is based on the digital input signal. The second stage is configured to receive a pulse width modulation quantization error of the first stage, scale the pulse width modulation quantization error of the first stage by a gain factor to produce a scaled pulse width modulation quantization error of the first stage, and output a second analog intermediate output signal based on the scaled pulse width modulation quantization error of the first stage. A summation circuit combines the first and second analog intermediate output signals to generate an amplified output signal.

20 Claims, 3 Drawing Sheets

CASCADED CLASS D AMPLIFIER WITH IMPROVED LINEARITY

FIELD OF DISCLOSURE

The disclosed system and method relate to switching amplifiers. More particularly, the disclosed system and method relate to Class D amplifiers.

BACKGROUND

Amplifiers are classified based on certain operating characteristics. For example, Class A amplifiers conduct signal current throughout the cycle of the signal wave, i.e., have 360 degree conduction. Class B amplifiers conduct signal current for exactly one half the cycle of the current waveform, i.e., 180 degree conduction. Class AB amplifiers are Class B amplifiers with a bias voltage to avoid cross-over distortion, and Class C amplifiers have more than 180 degree conduction and resonant loading.

Class D amplifiers have zero degree conduction and utilized switched power stage transistors to prevent the amplifier from entering the active region. These amplifiers are frequently included in audio systems such as home theater systems, mobile phones, and speakers. However, conventional Class D amplifiers suffer from limited linearity and require high precision analog components and analog control loops that are difficult to design.

DETAILED DESCRIPTION

This description of the exemplary embodiments is intended to be read in connection with the accompanying drawings, which are to be considered part of the entire written description.

The improved Class D amplifier disclosed herein advantageously utilizes a plurality of cascaded pulse width modulation stages that may be independently weighted to improve linearity and achieve high effective resolution of the amplifier. Additionally, much of the signal processing is performed digitally to improve the accuracy and limit the amount of error introduced into the signal being amplified. For example, the improved amplifiers disclosed herein extract errors from a prior stage induced by pulse width modulation ("PWM") conversion in the digital domain and reduces the overall errors in the amplified system through digital and analog gain scaling.

Figure 1:
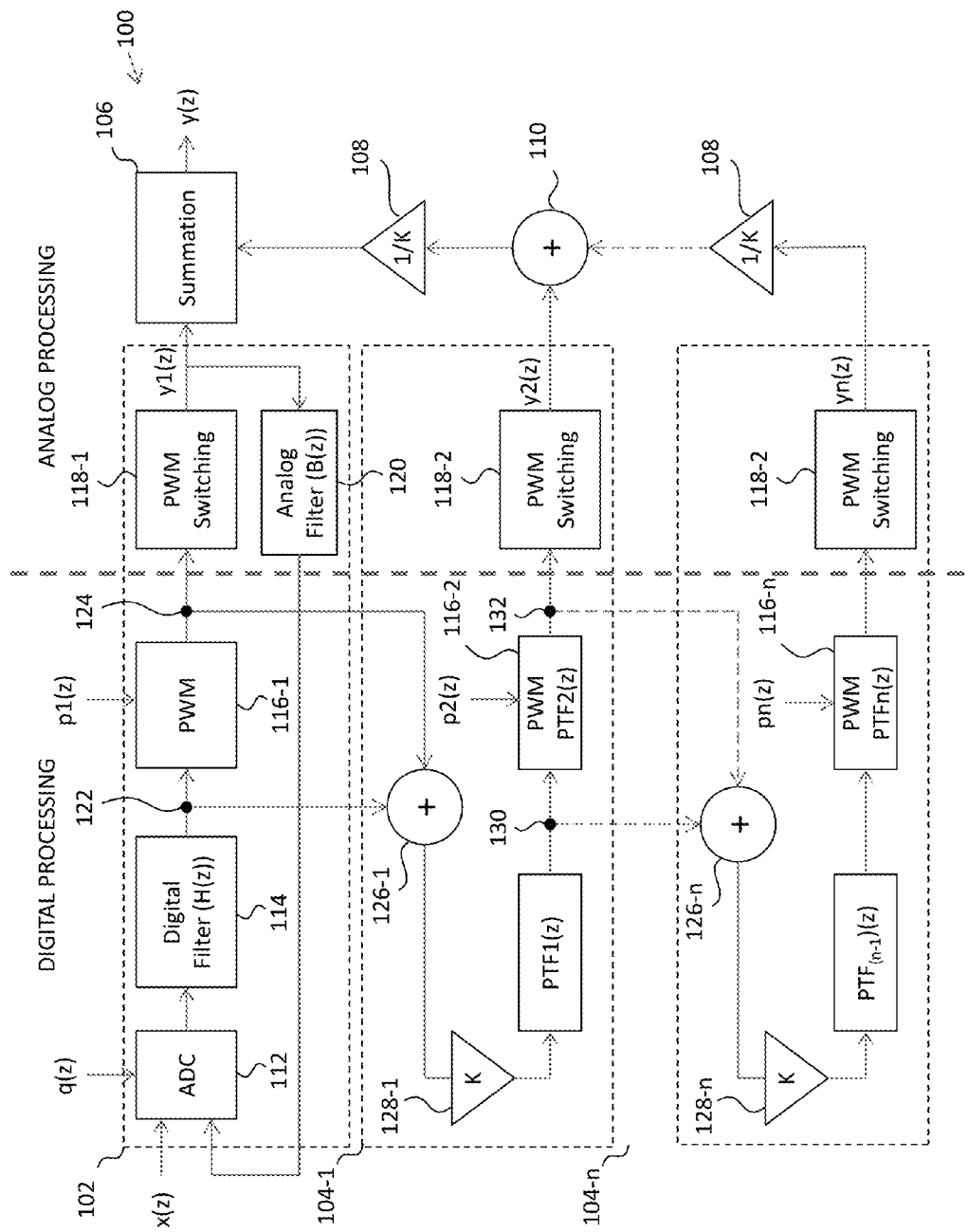
FIG. 1 is one example of a topology of an improved multi-stage Class D amplifier.

FIG. 1 illustrates one example of a topology an improved Class D amplifier 100 including a first stage 102 and a number, n, of PWM stages 104-1, 104-n (collectively referred to as "PWM stages 104"). The analog outputs, y1(z), y2(z), yn(z) of each of the stages 102, 104 are summed together in the analog domain at a summation block 106, which combines the outputs y1(z), y2(z), yn(z) from each stage 102, 104 to produce the output y(z) of amplifier 100 after the outputs from each PWM stage 104 pass through a gain reduction stage 108 and are summed together at intermediate summation stage 110.

Stage 102 receives an analog input signal x(z) at an input of an analog to digital converter ("ADC") 112. Quantization error q(z) is introduced into stage 102 by ADC 112 as ADC converts the analog input signal x(z) to a digital signal. ADC 112 outputs a digital version of the analog input signal to digital filter 114 having a transfer function, H(z). The filtered digital signal is output to a digital PWM generation block 116-1, which also introduces a PWM quantization error p1(z) into stage 102 of amplifier 100. The output of digital PWM generation block 116 is output to a PWM switching block 118-1, which may include a pair of switching MOSFET transistors as will be understood by one skilled in the art. The switching MOSFET transistors of PWM switching block 118-1 output an analog intermediate output signal y1(z) to summation block 106 and to analog filter 120 having a transfer function B(z), which outputs a filtered feedback signal to ADC 112.

PWM stage 104-1 receives the output of digital filter 114 from node 122 and the output of PWM generation block 116-1 from node 124 of stage 102 at intermediate summing circuit 126-1. Intermediate summing circuit 126-1 outputs a combined signal, which includes the quantization error/noise of stage 102, to a gain circuit 128-1 having a gain factor of K. The output of gain circuit 128-1, as modified by the transfer function PTF1(z) of the PWM generation block 116 of stage 102, is received at node 130. The digital signal at node 130 is received at digital PWM generation block 116-2 having a transfer function of PTF2(z). The output of digital PWM generation block 116-2 drives the PWM switching block 118-2 of stage 104-1. PWM switching stage 118-2 outputs an analog intermediate output signal y2(z) to intermediate summation stage 110.

The nth PWM stage 104-n includes an intermediate summation circuit 126-n that receives a pair of digital signals from the previous stage that is used to characterize the PWM quantization error introduced by the prior stage. In the example illustrated in FIG. 1 in which the nth stage is illustrated as a third stage, summation circuit 126-n receives the digital signal from node 130 and the digital signal output to node 132 from digital PWM generation circuit 116-2. Summation circuit 126-n outputs a summed digital signal to gain circuit 128-n having a gain value of K. Although the values of gain stages 128-1, 128-n are illustrated as being equal to K, i.e., the same, one skilled in the art will understand that gain circuits 128 in different stages 104 may be independently weighted, i.e., the value of K may differ from one stage 104 to another stage 104. The signal output from gain circuit 128-n is based on, or modified in accordance with, the transfer function PTF(n−1) (z) of the previous stage, which in this example is the second stage. The signal is then received at digital PWM generation block 116-n, which injects PWM quantization error pn(z) into system 100.

The signal output from digital PWM generation block 116-n drives the PWM switching block 118-n of stage 104-n. PWM switching stage 118-n outputs an analog intermediate output signal yn(z) to an analog gain reduction stage 108 having a gain of 1/K. As described above, analog gain reduction stage 108 outputs a signal to intermediate summation stage 110 wherein the signal output from analog gain reduction stage 108 is combined with the signal output from PWM switching block 118-2, y2(z). The output of intermediate summation stage 110 is passes through another gain reduction stage 108 and is combined with the analog intermediate output signal, y1(z), of stage 102. Summation block 106 outputs the final output signal, y(z).

The output signal, y(z) of system 100 may be mathematically expressed as follows:

$$y(z) = y1(z) + \frac{y2(z)}{k} + \ldots + \frac{yn(z)}{k^n}$$

Where, Eq. (1)

$$y1(z) = \frac{H(z)}{1 + H(z)B(z)}x(z) + \frac{H(z)}{1 + H(z)B(z)}q(z) + \frac{1}{1 + H(z)B(z)}p1(z)$$

$$y2(z) = -kp1(z)PTF1(z) + p2(z)PTF2(z) \quad \text{Eq. (3)}$$

$$yn(z) = -kp(n-1)PTFn(z) + pn(z)PTFn(z) \quad \text{Eq. (4)}$$

As used in Equations 2-4, the transfer function of the first stage, PTF1(z), is equal $$\text{to } \frac{1}{1 + H(z)B(z)}.$$

Substituting Equations 2-4 into Equation 1 yields:

$$y(z) = \frac{H(z)}{1 + H(z)B(z)}x(z) + \frac{H(z)}{1 + H(z)B(z)}q(z) + \frac{pn(z)PTFn(z)}{K^{n-1}} \quad \text{Eq. (5)}$$

As will be understood by one skilled in the art in looking at Equation 5, the transfer function PTF(Z) may be selected to spectrally shape the PWM quantization error pn(z). For example, a high pass filter may be selected to spectrally shape the PWM quantization error to be a high frequency that is out of the band of interest, which may be, for example, the audio band.

Figure 2:
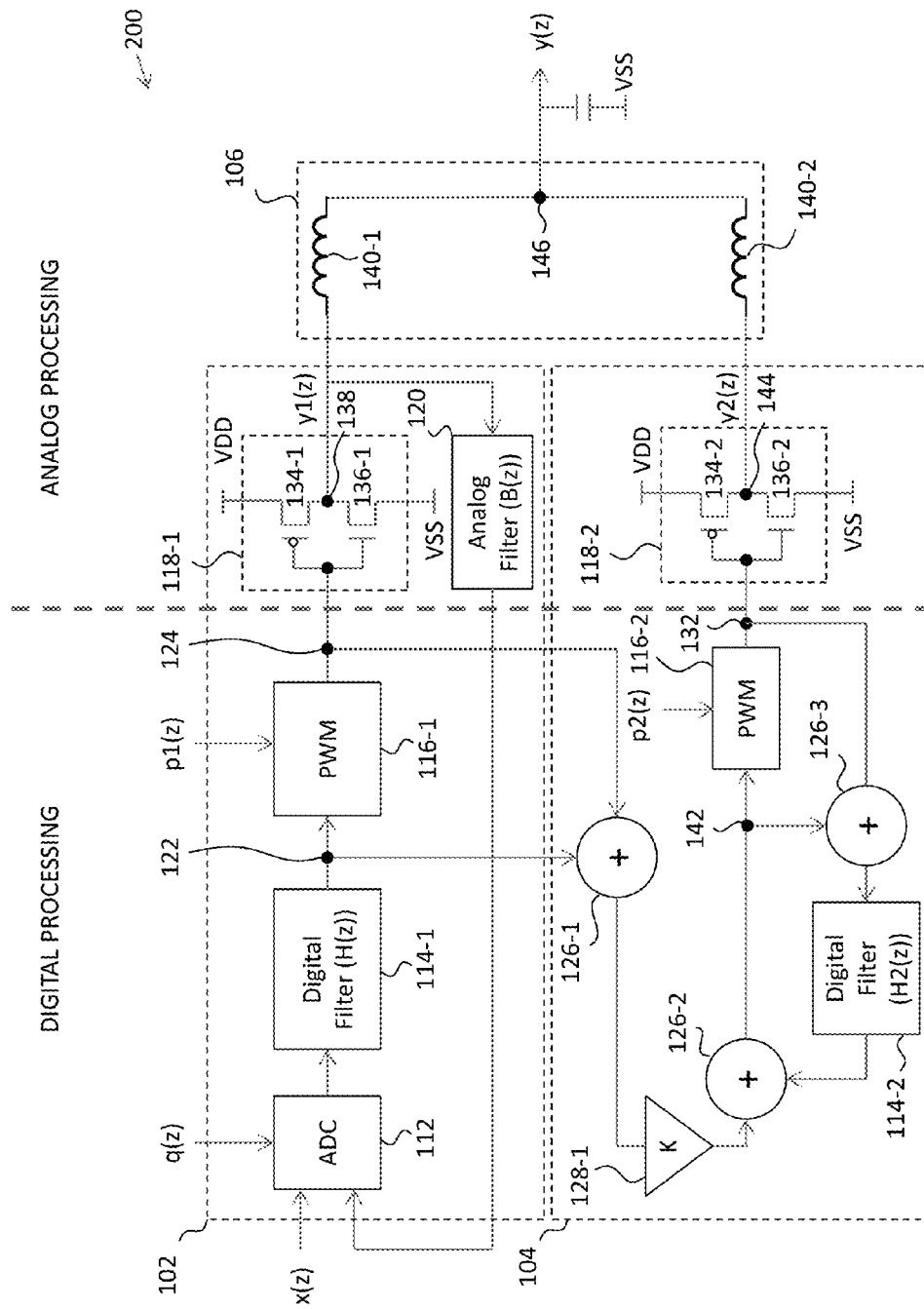
FIG. 2 is one example of a two-stage Class D amplifier in accordance with the multi-stage amplifier topology illustrated in FIG. 1.

FIG. 2 illustrates an implementation of a two-stage D Class amplifier 200 in accordance with the functional diagram illustrated in FIG. 1. As shown in FIG. 2, amplifier 200 includes a first stage 102 and a second stage 104. The first stage includes ADC 112 that receives input signal, x(z), and a feedback signal from analog filter 120 having a transfer function B(z). ADC 112 injects a quantization error q(z) into the signal being amplified by amplifier 200 and outputs a digital signal to digital filter 114-1. The filtered digital signal is output from digital filter 114-1 to node 112, which is coupled to digital PWM generation block 116-1 and to intermediate summation block 126-1.

Digital PWM generation block 116-1 outputs PWM driving signals to node 124, which is coupled to the gates of transistors 134-1 and 136-1 of PWM switching block 118-1. Transistor 134-1 may be PMOS transistor having its source coupled to a high voltage supply node, which may be set at VDD, and its drain coupled to the drain of transistor 136-1 at node 138. Transistor 136-1 may be an NMOS transistor having its source coupled to a low voltage supply node set at VSS or ground. The gates of transistors 134 and 136 are coupled together and at node 124. The output of digital PWM switching block 118-1, signal y1(z) from node 138, is fed back to ADC block 112 through analog filter having the transfer function, B(z) and is output to inductor 140-1 that functions as a portion of summation block 106.

Intermediate summation block 126-1 receives signals from nodes 122 and 124 of stage 102 and outputs a signal to gain circuit 128-1. Gain circuit 128-1 increases the gain of the signal received from intermediate summation block 126-1 by gain factor K. The output of gain circuit 128-1 is provided to intermediate summation block 126-2, which also receives a filtered feedback signal from digital filter 114-2 having transfer function H2(z). Intermediate summation circuit 126-2 outputs a signal to node 142, which is coupled to the input of digital PWM generation block 116-2 and to intermediate summation block 126-3. Intermediate summation circuit 126-3 injects quantization error p2(z) into the signal being amplified by amplifier 200 and outputs a signal to node 132.

Node 132 is coupled to an input of intermediate summation block 126-3 and to the input of PWM switching block 118-2. Intermediate summation block 126-3 receives signals from nodes 142 and 132 and outputs a combined signal to digital filter 114-2, which outputs a filtered digital feedback signal to summation block 126-2. PWM switching block 118-2 includes PMOS transistor 134-2 and NMOS transistor 136-2. PMOS transistor 134-2 has its source coupled to a high voltage supply node set at VDD and its drain coupled to the drain of transistor 136-2 at node 144. Transistor 136-2 has its source coupled to a low voltage power supply node set at VSS or ground. The gates of transistors 134-2 and 136-2 are coupled together and to node 132. Output signal y2(z) is output from output node 144 of PWM switching block 118-2 to include 140-2, which functions as a portion of summation block 106. Inductors 140-1 and 140-2 are both coupled to node 146, which outputs output signal y(z). A capacitor 148 may be coupled to node 146 and to ground or VSS.

For the example illustrated in FIG. 2, the output signal, y(z), can be expressed using Equation 5 as follows:

$$y(z) = \frac{H(z)}{1 + H(z)B(z)}x(z) + \frac{H(z)}{1 + H(z)B(z)}q(z) + \frac{p2(z)(1 - H2(z))}{K} \quad \text{Eq. (6)}$$

If $H2(z) = z^{-1}(2 - z^{-1})$, then the output signal, y(z), is expressed as follows:

$$y(z) = \frac{H(z)}{1 + H(z)B(z)}x(z) + \frac{H(z)}{1 + H(z)B(z)}q(z) + \frac{p2(z)(1 - z^{-1})^2}{K} \quad \text{Eq. (7)}$$

The numerator of the right-most term in Equation 7 is effectively low-pass filtering the error injected by digital PWM generator 116-2, which is then divided by the denominator, K. Accordingly, the K factor minimizes the injected error P2(z), which improves the linearity of amplifier 200.

Figure 3:
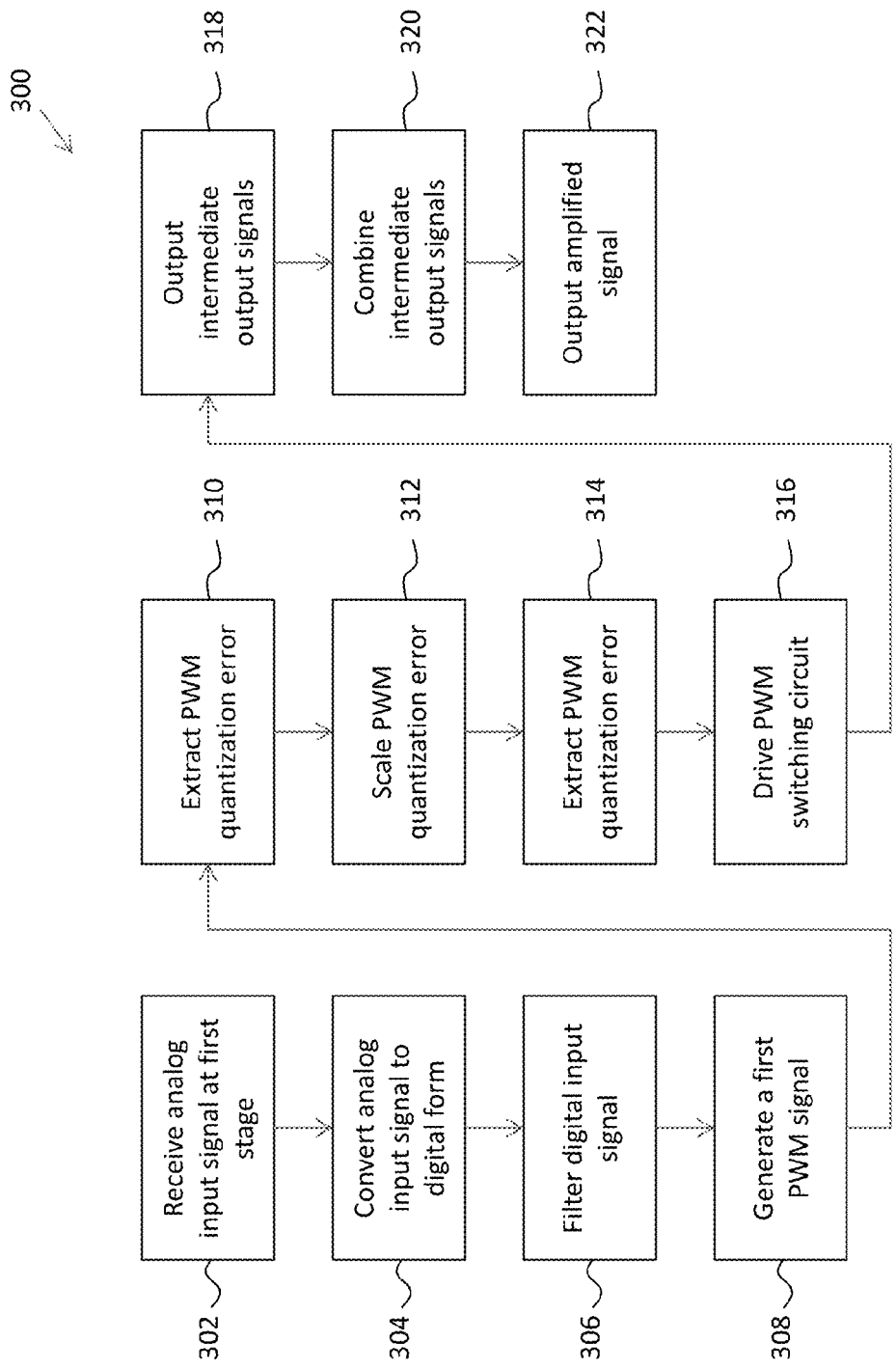
FIG. 3 is one example of a method of amplifying a signal in accordance with the improved Class D amplifier illustrated in FIG. 1.

The operation of an improved amplifier 100 is described with reference to FIG. 3, which is a flow diagram of an amplification method 300. At block 302, an analog input signal, x(z), is received at a first stage 102. As described above, input signal x(z) is received at an input of ADC 112. The analog input signal is converted to digital form at block 304 by ADC 112.

At block 306, the digital input signal is filtered by digital filter 114. Digital filter 114 may be a low-pass filter, a band-pass filter, a high-pass filter, or any other filter for a particular application as will be understood by one skilled in the art. A filtered digital input signal is output from digital filter 114.

At block 308, the filtered digital input signal is received at digital PWM generation block 116-1, which generates a digital PWM signal based on the filtered digital input signal.

Digital PWM generation block 116-1 induces a PWM quantization error as described above.

The PWM quantization error of stage 102 is extracted at block 310. Extraction of the PWM quantization error/noise in the digital domain is achieved by summing together the input and output signals of digital PWM generation block 116-1 at intermediate summation circuit 126-1. In embodiments in which more than two stages 102, 104 are implemented, the PWM quantization error of each stage may be extracted at block 308.

At block 312, the extracted digital PWM quantization is scaled by a gain factor, K. The scaling of the extracted PWM quantization error may be performed by a gain stage such as an operational amplifier or other gain circuit.

At block 314, the scaled PWM quantization error may be filtered by passing the scaled PWM quantization error signal through a digital filter. The digital filter may be a low-pass filter, a band-pass filter, a high-pass filter or other type of filter selected to achieve the desired filtering.

At block 316, PWM switching circuits are driven. For example, PWM switching circuit 118-1 in stage 102 receives the digital PWM signal from digital WPM signal generator 116-1. As shown in FIG. 2, PWM switching circuit 118-1 includes a pair of transistors 134-1, 136-1 each having their respective gates coupled to receive the PWM signal from digital PWM generation block 116-1.

The PWM switching circuits 118 in each of the additional PWM stages 104 receive signals from digital PWM signal generators 116-2, ..., 116-$n$. For example, the output of each digital PWM generator 116 in stages 104 is coupled to the gates of a pair of transistors 134, 136 disposed in series between first and second supply voltage nodes.

At block 318, the PWM switching circuits 118 output intermediate output signals in response to signals received from digital PWM generation circuits 116. For example, a first intermediate output signal, $y1(z)$, is output from stage 102, and additional intermediate output signals, $y2(z)$, ..., $yn(z)$, are output from each of the PWM switching circuits 118 in stages 104-1, ..., 104-$(n-1)$. The intermediate output signals are generated in response to transistors 134 and 136 in each of the respective PWM switching circuits 118 selectively turning on and off based on the digital PWM signals received from digital PWM generation blocks 116. The turning on and off of transistors 134 and 136 selectively couples the output nodes of the PWM switching circuits 118 to one of the first or second voltage supply nodes, which may be set at VDD or VSS.

At block 220, the intermediate output signals are combined into a single output signal. In some embodiments, such as the embodiment illustrated in FIG. 2, the intermediate output signals are summed together by inductors 140-1, 140-2. The amplified output signal is output from the amplifier at block 222.

As described above, the use of cascaded PWM stages that may be independently weighted advantageously improve the linearity of Class D amplifiers. Additionally, performing a majority of the signal processing in the digital domain improves the accuracy and limits the amount of error introduced into the signal being amplified.

In some embodiment, an amplifier includes first and second stages. The first stage includes an input node for receiving an analog input signal, an analog digital converter for converting the analog input signal to a digital input signal, and a first switching circuit for outputting a first analog intermediate output signal in response to receiving a digital pulse width modulated signal that is based on the digital input signal. The second stage is configured to receive a pulse width modulation quantization error of the first stage, scale the pulse width modulation quantization error of the first stage by a gain factor to produce a scaled pulse width modulation quantization error of the first stage, and output a second analog intermediate output signal based on the scaled pulse width modulation quantization error of the first stage. A summation circuit combines the first and second analog intermediate output signals to generate an amplified output signal.

In some embodiments, a method includes receiving an analog input signal at an input node of a first stage, converting the analog input signal to a digital input signal, and generating a first digital pulse width modulated signal based on the digital input signal. A first quantization error induced by the generation of the first digital pulse width modulated signal is received at a second stage. The first quantization error is scaled by a gain factor. A second digital pulse width modulated signal is generated based on the scaling of the first quantization error. A first analog intermediate output signal is output from the first stage and a second analog intermediate output signal from the second stage. The first and second analog intermediate output signals are combined to provide an amplified output signal.

In some embodiments, a Class D amplifier includes a first stage and a plurality of cascaded stages coupled to the first stage. The first stage includes an input node coupled to receive an analog input signal, an analog digital converter configured to convert the analog input signal to a digital input signal, and a first switching circuit configured to output a first analog intermediate output signal in response to receiving a digital pulse width modulated signal that is based on the digital input signal. Each of the cascaded stages is configured to receive a pulse width modulation quantization error of a previous stage to which the stage is directly coupled, scale the pulse width modulation quantization error by a gain factor to produce scaled pulse width modulation quantization errors of the previous stage, and output a respective analog intermediate output signal based on the scaled pulse width modulation quantization errors of the previous stage. A summation circuit is configured to combine the analog intermediate output signals to generate an amplified output signal.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An amplifier, comprising:
a first stage including
an input node coupled to receive an analog input signal,
an analog to digital converter configured to convert the analog input signal to a digital input signal, and
a first switching circuit configured to output a first analog intermediate output signal in response to receiving a digital pulse width modulated signal that is based on the digital input signal;
a second stage coupled to the first stage, the second stage configured to:
receive a pulse width modulation quantization error of the first stage,
scale the pulse width modulation quantization error of the first stage by a gain factor to produce a scaled pulse width modulation quantization error of the first stage, and
output a second analog intermediate output signal based on the scaled pulse width modulation quantization error of the first stage; and a summation circuit configured to combine the first and second analog intermediate output signals to generate an amplified output signal.

2. The amplifier of claim 1, further comprising a third stage coupled to the second stage, the third stage configured to:
extract a pulse width modulation quantization error from the second stage,
scale the pulse width modulation quantization error from the second stage by the gain factor, and
output a third analog intermediate output signal to the summation circuit.

3. The amplifier of claim 2, wherein the summation circuit is configured to combine the first, second, and third analog intermediate output signals to generate the amplified output signal.

4. The amplifier of claim 1, wherein the first stage includes
a digital filter configured to filter the digital input signal output from the analog to digital converter; and
a digital pulse width modulation generation circuit configured to generate the digital pulse width modulated signal in response to receiving the filtered digital input signal received from the digital filter.

5. The amplifier of claim 4, wherein the second stage includes
a digital pulse width modulation generation circuit configured to generate a second digital pulse width modulated signal in response to receiving the scaled pulse width quantization error of the first stage from a gain circuit; and
a second switching circuit configured to output the second analog intermediate output signal in response to receiving the second digital pulse width modulated signal.

6. The amplifier of claim 5, wherein the first switching circuit includes
a first transistor having a source coupled to a first power supply node, a gate coupled to a first node coupled to receive the digital pulse width modulated signal based on the digital input signal, and a drain coupled to a second node for outputting the first analog intermediate output signal; and
a second transistor having a source coupled to a second power supply node, a gate coupled to the first node, and a drain coupled to the second node.

7. The amplifier of claim 6, wherein the second switching circuit includes
a third transistor having a source coupled to the first power supply node, a gate coupled to a third node coupled to receive the second digital pulse width modulated signal, and a drain coupled to a fourth node for outputting the second analog intermediate output signal; and
a fourth transistor having a source coupled to a second power supply node, a gate coupled to the third node, and a drain coupled to the fourth node.

8. The amplifier of claim 1, wherein the first switching circuit includes
a first transistor having a source coupled to a first power supply node, a gate coupled to a first node coupled to receive the digital pulse width modulated signal based on the digital input signal, and a drain coupled to a second node for outputting the first analog intermediate output signal; and
a second transistor having a source coupled to a second power supply node, a gate coupled to the first node, and a drain coupled to the second node.

9. The amplifier of claim 1, wherein an analog filter is disposed in a feedback loop of the first stage such that the analog filter is coupled to an output of the first switching circuit and to the input node.

10. A method, comprising:
receiving an analog input signal at an input node of a first stage;
converting the analog input signal to a digital input signal;
generating a first digital pulse width modulated signal based on the digital input signal;
receiving, at a second stage, a first quantization error induced by the generation of the first digital pulse width modulated signal;
scaling the first quantization error by a gain factor;
generating a second digital pulse width modulated signal based on the scaling of the first quantization error;
outputting a first analog intermediate output signal from the first stage and a second analog intermediate output signal from the second stage; and
combining the first and second analog intermediate output signals to provide an amplified output signal.

11. The method of claim 10, further comprising filtering the digital input signal to produce a filtered digital input signal, wherein the first digital pulse width modulated signal is generated in response to the filtered digital input signal.

12. The method of claim 10, further comprising:
receiving, at a third stage, a second quantization error induced by the generation of the second digital pulse width modulated signal;
scaling the second quantization error by the gain factor; and
outputting a third analog intermediate output signal from the third stage,
wherein the first, second, and third analog intermediate output signals are combined to provide the amplified output signal.

13. A Class D amplifier, comprising:
a first stage including
an input node coupled to receive an analog input signal,
an analog to digital converter configured to convert the analog input signal to a digital input signal, and
a first switching circuit configured to output a first analog intermediate output signal in response to receiving a digital pulse width modulated signal that is based on the digital input signal;
a plurality of cascaded stages coupled to the first stage, each of the cascaded stages configured to:
receive a pulse width modulation quantization error of a previous stage to which the stage is directly coupled,
scale the pulse width modulation quantization error by a gain factor to produce scaled pulse width modulation quantization errors of the previous stage, and
output a respective analog intermediate output signal based on the scaled pulse width modulation quantization errors of the previous stage; and
a summation circuit configured to combine the analog intermediate output signals to generate an amplified output signal.

14. The Class D amplifier of claim 13, wherein the first stage includes
a digital filter configured to filter the digital input signal output from the analog to digital signal; and
a digital pulse width modulation generation circuit configured to generate the digital pulse width modulated signal in response to receiving the filtered digital input signal received from the digital filter.

15. The Class D amplifier of claim 14, wherein at least one of the plurality of cascaded stages includes
- a digital pulse width modulation generation circuit configured to generate a second digital pulse width modulated signal in response to receiving the scaled pulse width quantization error of the first stage from a gain circuit; and
- a second switching circuit configured to output the second analog intermediate output signal in response to receiving the second digital pulse width modulated signal.

16. The Class D amplifier of claim 15, wherein the first switching circuit includes
- a first transistor having a source coupled to a first power supply node, a gate coupled to a first node coupled to receive the digital pulse width modulated signal based on the digital input signal, and a drain coupled to a second node for outputting the first analog intermediate output signal; and
- a second transistor having a source coupled to a second power supply node, a gate coupled to the first node, and a drain coupled to the second node.

17. The Class D amplifier of claim 16, wherein the second switching circuit includes
- a third transistor having a source coupled to the first power supply node, a gate coupled to a third node coupled to receive the second digital pulse width modulated signal, and a drain coupled to a fourth node for outputting the second analog intermediate output signal; and
- a fourth transistor having a source coupled to a second power supply node, a gate coupled to the third node, and a drain coupled to the fourth node.

18. The Class D amplifier of claim 13, wherein the first switching circuit includes
- a first transistor having a source coupled to a first power supply node, a gate coupled to a first node coupled to receive the digital pulse width modulated signal based on the digital input signal, and a drain coupled to a second node for outputting the first analog intermediate output signal; and
- a second transistor having a source coupled to a second power supply node, a gate coupled to the first node, and a drain coupled to the second node.

19. The Class D amplifier of claim 13, wherein each of the plurality of cascaded stages includes
- a digital pulse width modulation generation circuit configured to generate a respective digital pulse width modulated signal in response to receiving a scaled pulse width quantization error of a previous stage to which the stage is directly coupled, and
- a switching circuit configured to output the respective analog intermediate output signal in response to receive the respective digital pulse width modulated signal.

20. The Class D amplifier of claim 13, wherein an analog filter is disposed in a feedback loop of the first stage such that the analog filter is coupled to an output of the first switching circuit and to the input node.

* * * * *